United States Patent [19]

Maniar et al.

[11] Patent Number: 5,510,651
[45] Date of Patent: Apr. 23, 1996

[54] SEMICONDUCTOR DEVICE HAVING A REDUCING/OXIDIZING CONDUCTIVE MATERIAL

[75] Inventors: Papu D. Maniar; Reza Moazzami; C. Joseph Mogab, all of Austin, Tex.

[73] Assignee: Motorola, Inc., Schaumburg, Ill.

[21] Appl. No.: 342,293

[22] Filed: Nov. 18, 1994

Related U.S. Application Data

[62] Division of Ser. No. 72,012, Jun. 7, 1993.

[51] Int. Cl.$^6$ .................................................. H01G 4/10
[52] U.S. Cl. ........................ 257/751; 257/295; 257/762; 257/769
[58] Field of Search ........................ 257/295, 751, 257/753, 762, 769; 361/321

[56] References Cited

U.S. PATENT DOCUMENTS

| | | | |
|---|---|---|---|
| 3,657,029 | 4/1972 | Fuller | 156/11 |
| 4,851,895 | 7/1989 | Green et al. | 357/67 |
| 4,982,309 | 1/1991 | Shepherd | 361/321 |
| 5,003,428 | 3/1991 | Shepherd | 361/321 |
| 5,005,102 | 4/1991 | Larson | 361/313 |
| 5,122,923 | 6/1992 | Matsubara et al. | 361/321 |
| 5,142,437 | 8/1992 | Kammerdiner et al. | 361/313 |
| 5,386,088 | 1/1995 | Gardner | 174/261 |

FOREIGN PATENT DOCUMENTS

| | | | |
|---|---|---|---|
| 409018 | 1/1991 | European Pat. Off. | H01G 9/05 |
| 478799 | 4/1992 | European Pat. Off. | H01L 29/792 |
| 4364759 | 12/1992 | Japan | H01L 21/90 |

OTHER PUBLICATIONS

IBM Technical Disclosure Bulletin; "Diffusion Barrier Between Copper and Silicon;" vol. 35, No. 1B, pp. 214–215 (1992).
Bernstein, et al.; "Fatigue of ferroelectric PbZrxTiyO3 capacitors with Ru and RuOx electrodes"; J. Mater. Res.; vol. 8, No. 1, pp. 12–13 (Jan. 1993).
Brassington; "Memory Applications Of Ferroelectric Thin Films"; IEDMS, pp. 1–8 (1990).
Wolf, et al.; "Silicon Processing for the VLSI Era"; vol. 1; pp. 171–175 (1986).
Dickerson, et al.; "Chemical Principals"; Second Edition; pp. 662–670 (1974).

Primary Examiner—Jerome Jackson, Jr.
Assistant Examiner—Donald L. Morin, Jr.
Attorney, Agent, or Firm—George R. Meyer

[57] ABSTRACT

The present invention includes a semiconductor device having a layer including an elemental metal and its conductive metal oxide, wherein the layer is capable being oxidized or reduced preferentially to an adjacent region of the device. The present invention also includes processes for forming the devices. Substrate regions, silicon-containing layers, dielectric layers, electrodes, barrier layers, contact and via plugs, interconnects, and ferroelectric capacitors may be protected by and/or formed with the layer. Examples of elemental metals and their conductive metal oxides that may be used with the present invention are: ruthenium and ruthenium dioxide, rhenium and rhenium dioxide, iridium and iridium dioxide, osmium and osmium tetraoxide, or the like.

6 Claims, 5 Drawing Sheets

5,510,651

SEMICONDUCTOR DEVICE HAVING A REDUCING/OXIDIZING CONDUCTIVE MATERIAL

This is a divisional of application Ser. No. 08/072,012, filed Jun. 7, 1993.

FIELD OF THE INVENTION

The present invention relates to the field of semiconductor devices, and in particular, to a semiconductor device having a layer of an elemental metal and its conductive metal oxide.

BACKGROUND OF THE INVENTION

Semiconductor devices may have a layer in which electrical characteristics are changed if the layer is oxidized or reduced. With conductive materials, such as substrate regions, silicon members, contacts, vias, and interconnects and the like, oxidation is typically to be prevented or at least minimized. Conventional materials used for conductive materials may include silicon (monocrystalline, polycrystalline, and amorphous), metals, and metal-containing compounds. Oxides of most of these materials typically are insulators. The formation of insulating oxides can result in electrical opens, which may not be desired.

In some semiconductor devices, reducing agents may pose a problem. In capacitors using oxide ferroelectric materials as the dielectric, a reducing atmosphere may cause the ferroelectric to become degraded. The ferroelectric may lose enough of its ferroelectric properties to become virtually useless as a ferroelectric capacitor. Ferroelectric capacitors appear to be more sensitive with respect to this problem than many semiconductor devices. Processing with a relatively inert ambient, such as nitrogen, argon, helium, and the like, without any oxidizing gases may still cause ferroelectric capacitors to become degraded.

In addition to ferroelectric capacitors, other semiconductor devices may have problems with reducing agents, such as hydrogen. Hydrogen may accelerate hot electron degradation of many types of electrically programmable read only memories (EPROMs) and particularly electrically erasable EPROMs (EEPROMs). Hot carrier transport through a gate or tunnel dielectric layer generally lessens the number of times the EEPROM may be cycled, wherein a cycle is the combination of a programming step and In erasing step. Also, hydrogen may react with oxygen to form moisture. Moisture in an EPROM generally causes data retention problems.

SUMMARY OF THE INVENTION

The present invention includes a semiconductor device comprising a substrate having a primary surface, a first region, and a first layer. The first region is either located within the substrate adjacent to the primary surface or located over the substrate. The first layer overlies the first region and includes an elemental metal and its conductive metal oxide. The reactions to oxidize the elemental metal and reduce the conductive metal oxide are reversible. The first layer is oxidized or reduced preferentially to the first region. The present invention also includes the process for forming the device.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE EMBODIMENTS

Figure 1:
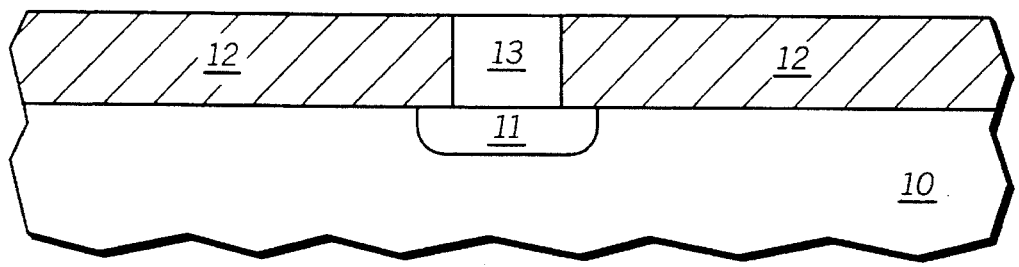
FIGS. 1 and 2 each include a cross-sectional view of a portion of a substrate at various process steps in forming a layer having a metallic compound that includes an elemental metal and its conductive metal oxide over a contact plug in accordance with one embodiment of the present invention.

The present invention includes a semiconductor device having a material including an elemental metal and its conductive metal oxide, wherein the material is capable of being oxidized or reduced preferentially to an adjacent region of the device. The material lessens the likelihood that the adjacent region is oxidized or reduced when this is undesired. A general description is followed by applications in which the material may be used. The applications that are described below are illustrative and are not meant to be limiting.

General Description

Gibbs free energy changes are used to determine which material should be placed adjacent to a region to lessen the likelihood of oxidizing or reducing the region. For example, if the adjacent region is not to be reduced, the material should be more easily reduced compared to the adjacent region, and if the adjacent region is not to be oxidized, the material should be more easily oxidized compared to the adjacent region. Many materials cannot be used with this invention because a change in oxidation state changes the electrical properties of the material. For example, titanium is a conductor and can be oxidized to form a titanium oxide ($TiO_x$ where x is no more than two.) Titanium monoxide (TiO) is a semiconductor, and titanium dioxide ($TiO_2$) is an insulator. Therefore, the titanium material may change from a conductor to a semiconductor or an insulator or vice versa. These changes usually cause unwanted electrical characteristics within a semiconductor device. In order to avoid the transformation from a conductor to a semiconductor or an insulator or vice versa, the material in both its oxidized and reduced forms should either be both conductors, both semiconductors, or both insulators.

A category of materials that may be used with the present invention are metals that can form conductive metal oxides. Ruthenium (Ru), rhenium (Re), iridium (Ir), and osmium (Os) are conductive and can be oxidized to form ruthenium dioxide ($RuO_2$), rhenium dioxide ($ReO_2$) or rhenium trioxide ($ReO_3$), iridium dioxide ($IrO_2$), and osmium tetraoxide ($OsO_4$), respectively, which are also conductive. Below illustrates the reaction for ruthenium:

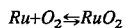

$$Ru + O_2 \leftrightarrows RuO_2$$

The double-headed arrow indicates that the reaction is reversible. Ruthenium can be oxidized to form ruthenium dioxide, and ruthenium dioxide can be reduced to form ruthenium and oxygen.

The present invention requires a mixture of the metal and its conductive metal oxide. The mixture allows the reactions to be more freely reversible compared to having just the metal or just the conductive metal oxide. If both are not present, extra energy and more importantly longer times are needed to form a mixture. If the mixture is to be preferentially reduced, the mixture should have enough of the conductive metal oxide, such as $RuO_2$, to lessen the likelihood of reducing an adjacent region. If the mixture is to be preferentially oxidized, the mixture should have enough of the metal, such as Ru, to reduce the likelihood of oxidizing an adjacent layer. The present invention may be used in a variety of applications including substrate regions, silicon members, contact and via plugs, ferroelectric capacitors, and interconnects. As used hereinafter, "elemental metal" is a monatomic metallic material, such as Ru, Re, Ir, Os, Pb, Cu, and the like. Some elemental metals have conductive metal oxides, such as $RuO_2$, $ReO_2$, $ReO_3$, $IrO_2$, $OsO_4$, and the like. Descriptions of some applications follow.

Contact and Via Plugs and Interconnects

The present invention may be used with or as part of a contact or via plug within a semiconductor device. The plug may be used to lessen the likelihood that an underlying layer would be oxidized or reduced. FIG. 1 includes a cross-sectional view of a portion of a semiconductor device having a substrate 10, a doped region 11 within the substrate 10, a patterned oxide layer 12, and a silicon plug 13. If the substrate would be oxidized, part of the silicon plug 13 would form to a silicon dioxide layer. Before an interconnect is formed over the plug 13, the silicon dioxide layer would have to be removed. The removal of the silicon dioxide layer may also remove the part of the patterned oxide layer 12. Therefore, it is advantageous to protect the silicon plug 13 prior to an oxidation step.

Figure 2:
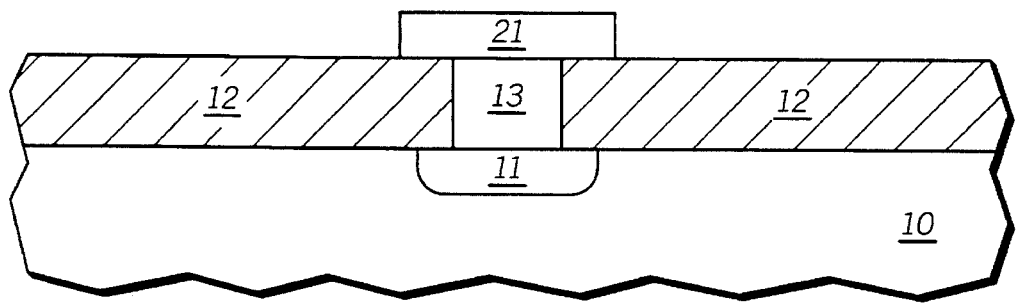

A conductive layer 21 is formed over the oxide layer 12 and patterned to form a protective cap over the silicon plug 13 as shown in FIG. 2. The conductive layer 21 includes a mixture of an elemental metal and its conductive metal oxide. Layer 21 may be formed by sputter depositing using a target having a mixture of the elemental metal and the conductive metal oxide. When the layer includes Ru and $RuO_2$, about 5–95 percent of all of the atomic ruthenium in the sputter target is Ru and the balance of the atomic ruthenium in the target is $RuO_2$. In this case, the sputter target and layer 21 have similar compositions. Layer 21 may be formed using other methods. For example, reactive ion sputtering using a Ru target and a plasma including oxygen may be used to deposit layer 21. In addition, a layer of Ru may be formed by sputter deposition or chemical vapor deposition and subsequently oxidized to convert only part of the Ru to $RuO_2$. In another embodiment, a layer of Ru and a layer of $RuO_2$ may be sequentially deposited. Additional layers of Ru and $RuO_2$ may be deposited. Regardless of the method used to form layer 21, about 5–95 percent of all atomic ruthenium present in layer 21 is Ru and balance of the atomic ruthenium in the layer 21 is $RuO_2$. In other embodiments, layer 21 may include Re and any of its oxides, Ir and $IrO_2$, Os and $OsO_4$, or the like. As used in this specification, "Re and any of its oxides" includes Re and $ReO_2$, Re and $ReO_3$, or Re and $ReO_2$ and $ReO_3$.

A masking layer (not shown) is formed over the layer 21 and patterned using a conventional lithographic technique. The layer 21 is patterned by ion milling the exposed portions of the layer 21 or by plasma etching the exposed portions of layer 21. If the layer 21 includes Ru and $RuO_2$, the plasma etching chemistry may include oxygen or fluorine-containing compounds, such as carbon tetrafluoride ($CF_4$) and the like. If other materials are used, other etching chemistries may be used. After the patterning step, the masking layer (not shown) is removed.

As can be seen in FIG. 2, the layer 21 covers the silicon plug 13. The layer 21 lessens the likelihood that the silicon plug 13 would be oxidized during a subsequent oxidation step. The Ru in layer 21 may be oxidized to form $RuO_2$. In order for silicon plug 13 to be oxidized under the layer 21, oxygen must migrate through the layer 21 before it reacts with the Ru in layer 21. Also, the layer 21 stays conductive even if the Ru is oxidized. A titanium layer cannot be used in place of layer 21 because titanium, which is a conductor, oxidizes to become titanium dioxide, which is an insulator. In other embodiments, the plug 13 may include a metal and its conductive metal oxide instead of silicon. In this manner, the substrate 10 and the region 11 may be better protected from oxidation, and electrical connections through plug 13 may be maintained.

Both contact and via plugs may be formed using the present invention. For example, plug 13 shown in FIG. 1 may be comprise Ru and $RuO_2$ that may lessen the likelihood of oxidizing a region within the substrate adjacent to the plug 13. Similarly, plug 13 may contact a silicon member, such as a gate electrode to prevent its oxidation. If plug 13 includes Ru and $RuO_2$, layer 21 shown in FIG. 2 is not needed. If hydrogen migration into regions within the substrate is a concern, about 5–95 atomic percent of all ruthenium within the plug 13 should be $RuO_2$.

Figure 3:
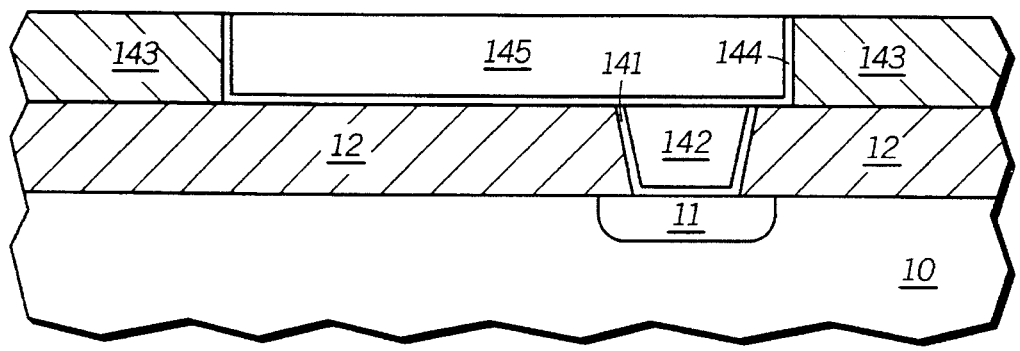
FIGS. 3, 5, and 6 each include a cross-sectional view of a portion of a substrate at various process steps in forming a layer having a metallic compound that includes an elemental metal and its conductive metal oxide over an interconnect in accordance with another embodiment of the present invention.

The application of the present invention to interconnects is similar to that for contact or via plugs. FIG. 3 includes a cross-sectional view of a portion of an integrated circuit including: a semiconductor substrate 10, a doped region 11 within the substrate 10, a first insulating layer 12 with a contact opening, a contact plug within the contact opening that includes a titanium nitride layer 141 and a tungsten layer 142. A second insulating layer 143 overlies the first insulating layer 12 and the contact plug. The second insulating layer 143 includes an interconnecting channel. A molybdenum layer 144 and a copper layer 145 are deposited over the second insulating layer 143 and within the interconnecting channel. The substrate is chemically-mechanically polished to remove portions of the molybdenum and copper layers 144 and 145 that lie outside the interconnecting channel to form the interconnect. The formation of the semiconductor device up to this point in the process is performed by conventional methods.

A problem with copper is that it may be oxidized. Below illustrates the reactions for forming various copper compounds:

$$4Cu + 2O_2 \rightleftharpoons 2Cu_2O + O_2 \rightleftharpoons 4CuO$$

Figure 4:
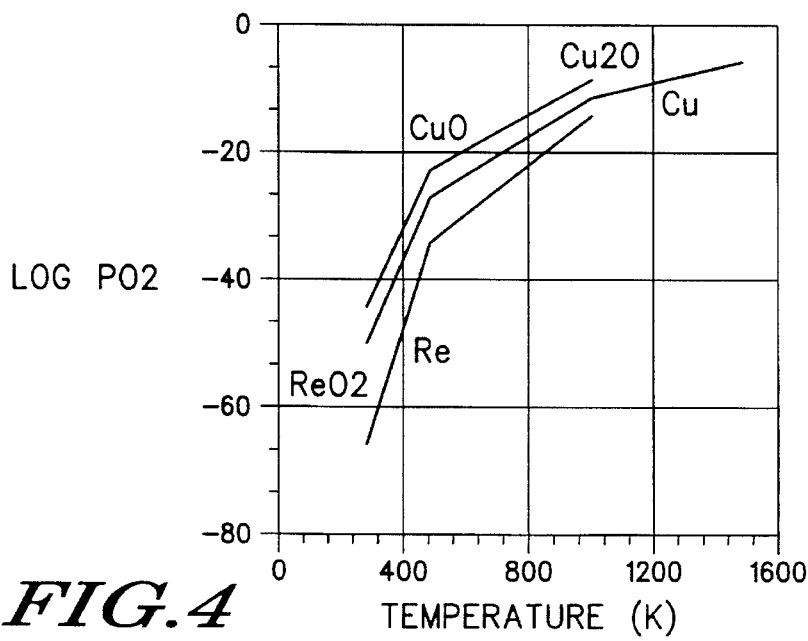
FIGS. 4 and 9 each include a graph showing various materials and their oxidation states given the logarithm of partial pressure of oxygen at the material and the temperature of the material.

FIG. 4 includes a graph illustrating the relationship of the logarithm of partial pressure of oxygen and temperature to the reduction/oxidation of the copper compounds. The y-axis for the graph is the logarithm of oxygen partial pressure (Log pO2) when the pressure is in units of atmospheres. The graph has three curves, two of which are related to copper compounds. In the upper, left-hand part of the uppermost curve, the reaction conditions favor the formation of CuO. In the region between the uppermost and intermediate curve, the reaction conditions favor the formation of $Cu_2O$. In the lower, right-hand side of the intermediate curve, the reaction conditions favor the formation of Cu. For a given temperature and oxygen partial pressure, one can predict which product (Cu, $Cu_2O$, or CuO) should be formed. For example, if the temperature is about 400 degrees Kelvin and Log pO2 is about −60, Cu should be formed. Similarly, at about 400 degrees Kelvin and Log pO2 of about −20, CuO should be formed. The curve indicates that at higher temperatures, a higher oxygen partial pressure is needed to oxidize Cu.

The inventors believe that placing a material that is more readily oxidized than Cu lessens the likelihood that Cu is oxidized to $Cu_2O$ or CuO. The lowermost curve in FIG. 4 is for Re and $ReO_2$. This curve is similar to the copper-related curves previously discussed. It is noted that the curve for $ReO_2/ReO_3$ is not shown in FIG. 4, but it would lie between the $Cu_2O/Cu$ curve and the $Re/ReO_2$ curve. FIG. 4 shows that Re is more readily oxidized to $ReO_2$ compared to Cu being oxidized to $Cu_2O$ or CuO because Re oxidizes at a lower Log pO2 compared to Cu for a given temperature. Both Re and $ReO_2$ are conductive, and a layer of Re and $ReO_2$ may be used over the interconnect 145 to lessen the likelihood that the Cu within the interconnect 145 will be oxidized.

Figure 5:
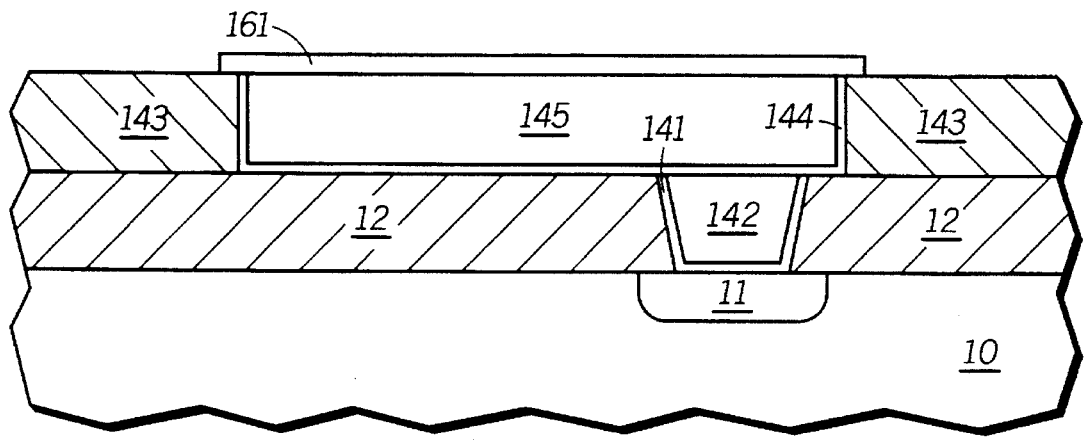
Figure 6:
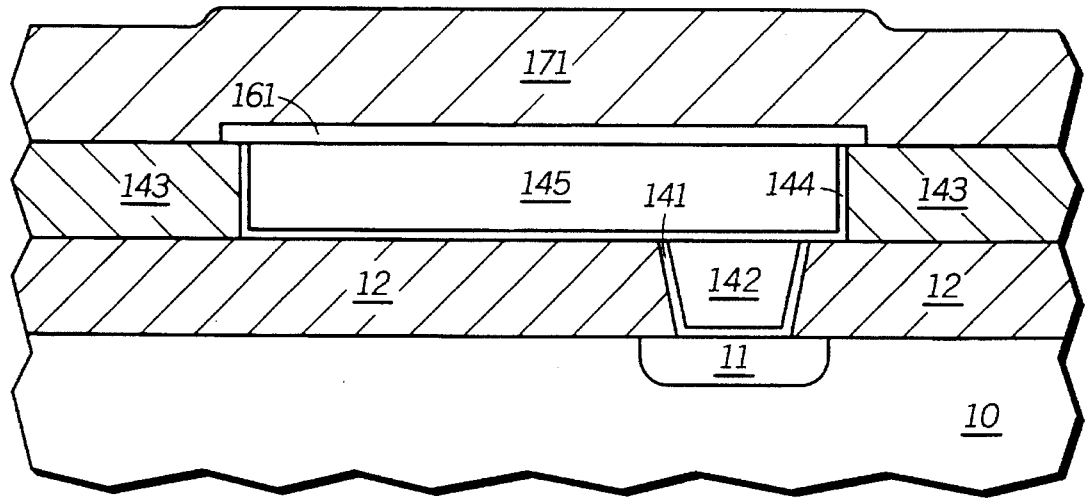

A conductive layer 161 is formed over the molybdenum and copper layers 144 and 145 as shown in FIG. 5. The conductive layer 161 includes Re and $ReO_2$, wherein about 5–95 atomic percent of all atomic rhenium in the layer is Re and the balance of the atomic rhenium in the layer is $ReO_2$. The formation of conductive layer 161 may be performed using the deposition and patterning methods previously described for Ru and $RuO_2$ except that ruthenium is being replaced by rhenium. A passivation layer 171 is formed over the conductive layer 161 to form a substantially completed integrated circuit as shown in FIG. 6. Other layers and electrical connections (not shown) may be formed if needed.

The present invention may be used to lessen the likelihood of oxidizing or reducing other parts of a semiconductor device including a silicon-containing layer overlying the substrate, a dielectric layer overlying the substrate, a barrier layer overlying the substrate, and electrodes, such as gate electrodes or capacitor electrodes, overlying the substrate.

Ferroelectric Capacitors

Figure 7:
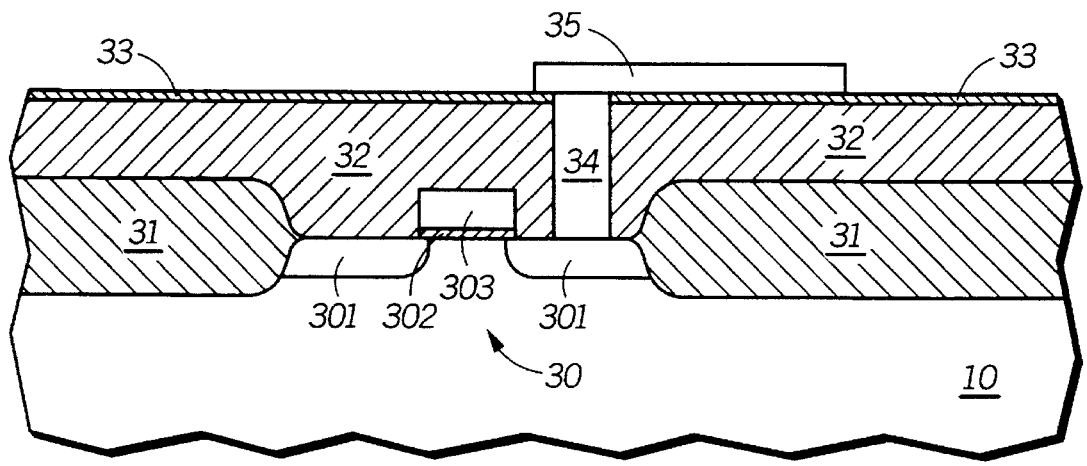
FIGS. 7, 8, 10, and 11 each include a cross-sectional view of a portion of a substrate at various process steps in forming an electrode for a ferroelectric capacitor, wherein the electrode includes an elemental metal and its conductive metal oxide in accordance with another embodiment of the present invention.

The present invention may be used in forming ferroelectric capacitors. FIG. 7 includes a cross-sectional view of a portion of a semiconductor device that includes: a semiconductor substrate 10; a metal-oxide-semiconductor transistor 30 having source/drain regions 301, a gate dielectric layer 302, and a gate electrode 303; field isolation regions 31 adjacent to the transistor 30; a first planarized insulating layer 32, a titanium dioxide layer 33, a contact plug 34, and a bottom electrode 35 that is about 500–2000 angstroms thick and comprises platinum. Conventional techniques are used to form the semiconductor device up to this point in the process. The titanium dioxide layer 33 and the bottom electrode 35 will contact a subsequently formed ferroelectric layer. Layer 33 and 35 may be replaced by or used in conjunction with other materials, but those materials must not react with the ferroelectric layer or allow underlying silicon-containing layers to react with the ferroelectric layer. Also, layer 33 must act as an insulator. In other embodiments, layer 33 may include oxides of magnesium, zirconium, tantalum, or the like. Electrode 35 must act as a conductor. In other embodiments, electrode 35 may include palladium, titanium nitride, metals and/or their conductive metal oxides (if the metal can form a conductive metal oxide), or the like.

Figure 8:
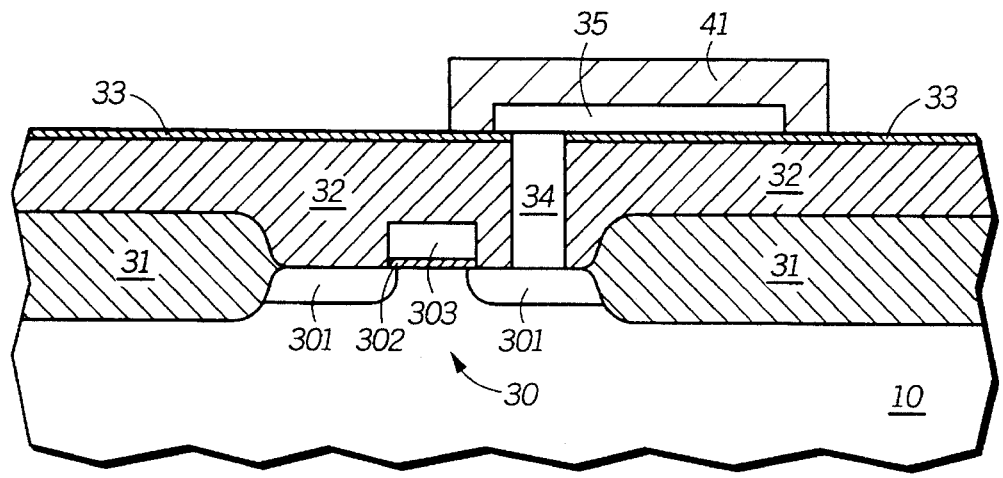

A patterned ferroelectric layer 41 about 700–2000 angstroms thick is formed over the bottom electrode 35 as shown in FIG. 8. The ferroelectric layer 41 includes lead zirconate titanate (PZT). It is noted that the word "zirconium" is sometimes used in place of "zirconate," but this is still the same material. The ferroelectric layer is deposited by spin coating, sputter depositing, or metalorganic chemical vapor deposition. The ferroelectric layer is annealed in an oxidizing ambient at about atmospheric pressure and a temperature in a range of 550–750 degrees Celsius. The annealing time is about 5–30 minutes if a furnace is used and about 10–300 seconds if a rapid thermal processor is used. The oxidizing ambient may include oxygen by itself or in combination with relatively inert gases, such as nitrogen, argon, helium, and the like. Non-oxidizing ambients, such as relatively inert gases without oxygen (nitrogen, argon, helium, or the like) and particularly reducing ambients, such as hydrogen, should be avoided unless the ferroelectric layer is subsequently annealed in an oxidizing ambient.

A masking layer (not shown) is formed over the ferroelectric layer 41. The ferroelectric layer 41 is patterned by wet or dry etching techniques. Wet etching may be performed with a solution including hydrofluoric acid, nitric acid, and hydrogen peroxide. The solution is maintained at about room temperature during the etch. Dry etching may be performed using plasma etching or ion milling. For plasma etching, the etching chemistry should include oxygen, fluorine-containing compounds, such as carbon tetrafluoride ($CF_4$) and the like, and chlorine-containing compounds, such as carbon tetrachloride ($CCl_4$), molecular chlorine ($Cl_2$), and the like. After patterning, the masking layer (not shown) is removed to give the patterned ferroelectric layer 41 as shown in FIG. 8.

Figure 9:
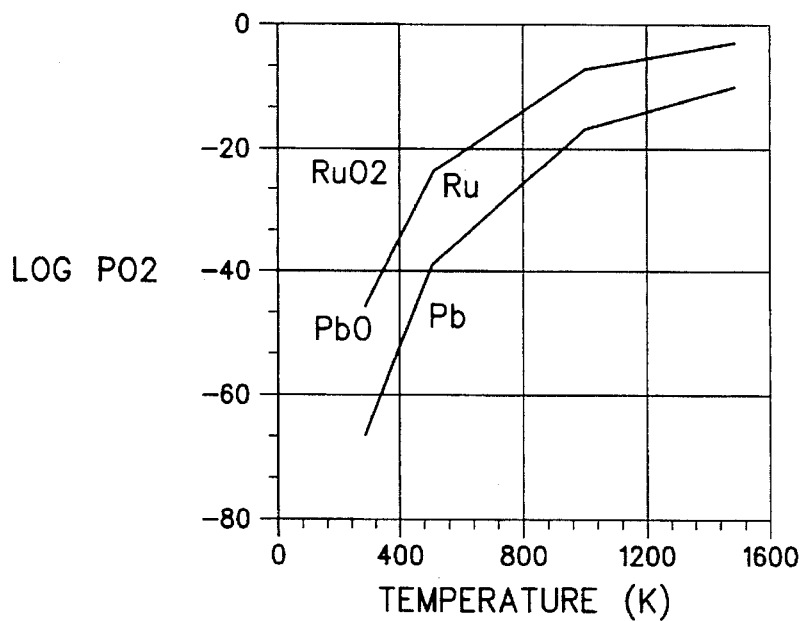

As previously discussed, one problem with ferroelectric capacitors is their inability to retain their ferroelectric properties. Although the source of the problem is not known, it is possible that the ferroelectric layer is being at least partially reduced during subsequent processing. Of the materials in PZT, lead is the most readily reduced. FIG. 9 is similar to FIG. 4 except that the graph has one curve for elemental lead (Pb) and lead oxide (PbO) and one curve for Ru and $RuO_2$. The curve indicates that at higher temperatures, a higher oxygen partial pressure is needed to keep PbO from being reduced to Pb. FIG. 9 shows that $RuO_2$ is more readily reduced to Ru compared to PbO being reduced to Pb. Both Ru and $RuO_2$ are conductive, and both do not significantly react with PZT. Therefore, Ru and $RuO_2$ may be used as the top electrode for the ferroelectric capacitor. Similarly, Re and any of its oxides, Ir and $IrO_2$, Os and $OsO_4$, or the like, may used as the top electrode. The top electrode must include both the elemental metal and its conductive metal oxide.

Figure 10:
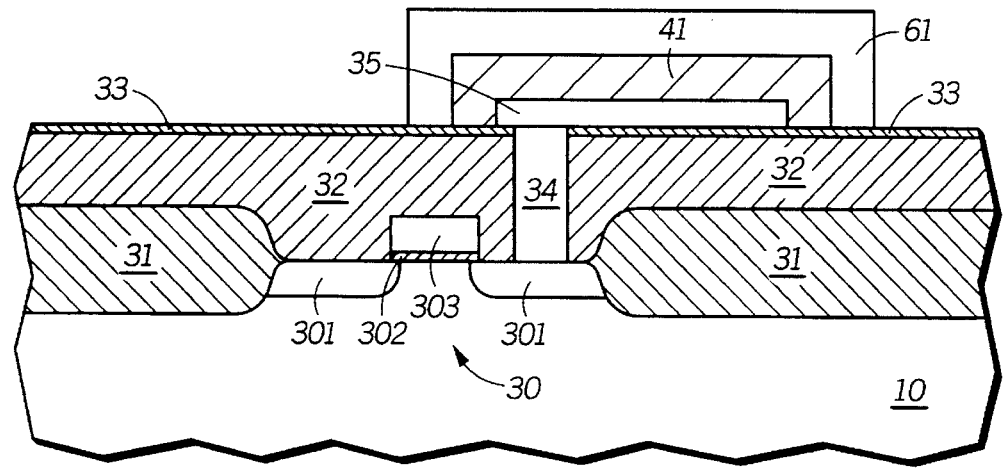

Referring to FIG. 10, a patterned top electrode 61 is formed to cover the top and outer sides of the ferroelectric layer 41. The top electrode 61 includes Ru and $RuO_2$, where about 5–95 percent of all of the atomic ruthenium in the top electrode 61 is $RuO_2$ and the balance of the atomic ruthenium in the top electrode 61 is Ru. It is noted that the top electrode 61 has more $RuO_2$ concentration compared to layer 21 or 161 because the top electrode 61 is to protect the PZT in the ferroelectric layer 41. Top electrode 61 is formed by sputter depositing a layer about 500–5000 angstroms thick using any of the methods previously described in forming the top electrode 61. Similar methods are used if the layer includes Re and any of its oxides, Ir and $IrO_2$, Os and $OsO_4$, or the like.

A masking layer (not shown) is formed over the layer of Ru and $RuO_2$ and patterned using a conventional lithographic technique. The layer of Ru and $RuO_2$ is patterned by ion milling or by plasma etching the exposed portion of the layer. If the layer includes Ru and $RuO_2$, the plasma etching chemistry may include oxygen or fluorine-containing compounds, such as carbon tetrafluoride ($CF_4$) and the like. If other materials are used, other etching chemistries may be used. After the patterning step, the masking layer (not shown) is removed thereby leaving the top electrode 61 as shown in FIG. 10.

As can be seen in FIG. 10, the top electrode 61 protects the top and outer sides of the ferroelectric layer 41. The $RuO_2$ in the top electrode 61 may be reduced to form Ru. The top electrode 61 lessens the likelihood that the ferroelectric layer 41 would be reduced during subsequent processing. In order for ferroelectric layer 41 to be reduced, a reducing agent must migrate through the top electrode 61 without reducing $RuO_2$. In this manner, the ferroelectric layer 41 may be better protected from reduction. The other metals and their conductive metal oxides may be replaced by or used in conjunction with the layer of Ru and $RuO_2$.

Figure 11:
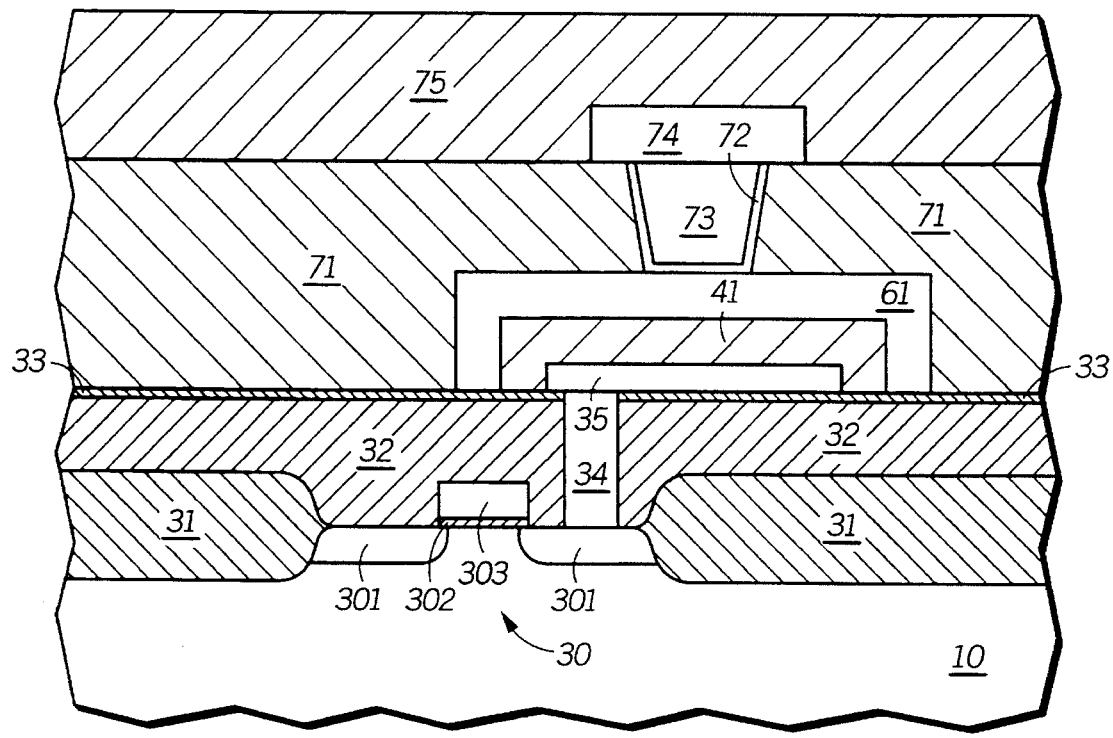

A substantially completed integrated circuit is formed as shown in FIG. 11. A second planarized insulation layer 71 is formed on the titanium dioxide layer 33 and the top electrode 61. An opening in layer 71 is formed that extends to the top electrode 61. A conductive plug is formed within the opening that includes a titanium nitride layer 72 and a tungsten layer 73. Other materials may be used in the conductive plug, but the ability of the Ru and $RuO_2$ to oxidize and reduce may limit the choices. The material used for the conductive plug should remain conductive. Besides titanium nitride, the layer that contacts the top electrode 61 may include titanium tungsten, tungsten, elemental metals and their conductive metal oxides, or the like. An interconnect 74 and a passivation layer 75 are formed over the conductive plug and layer 71. Other interlevel insulating and interconnecting layers may be formed, if needed. Electrical connections to other parts of the integrated circuit, such as the gate electrode 303 and the left-hand source/drain region 301, are formed but are not shown in FIG. 11.

Protective Layer Applications

The present invention may be used to form a protective layer. Although this embodiment is described in conjunction with a ferroelectric layer, the protective layer may be used for any number of devices. Silicon nitride is a good hydrogen barrier, but silicon nitride cannot come in direct contact with a PZT layer because of possible reactions between silicon and the PZT materials. Also, hydrogen may be produced during the formation of the silicon nitride layer, depending on the deposition chemistry chosen, that may reduce the oxide compounds within the ferroelectric layer.

Figure 12:
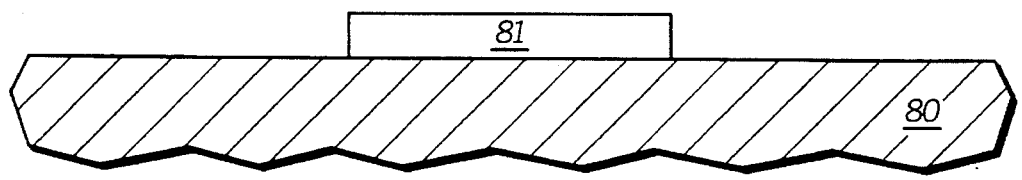
FIGS. 12–17 each include a cross-sectional view of a portion of a substrate illustrating a layer that includes an elemental metal and its conductive metal oxide in accordance with another embodiment of the present invention.
Figure 13:
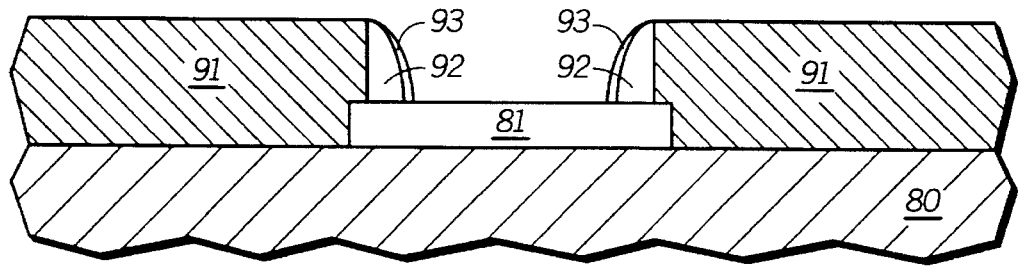

This application shows how a ferroelectric layer may be virtually encapsulated by protective layers including silicon nitride. FIG. 12 includes a cross-sectional view of a portion of semiconductor device that includes a first insulating layer 80 and a bottom electrode 81 that includes elemental iridium (Ir) or a mixture of Ir and iridium dioxide ($IrO_2$). The bottom electrode 81 is deposited and patterned similar to the other layers previously described that include metals and their conductive metal oxides. A patterned second insulating layer 91 is formed over the first insulating layer 80 and part of the bottom electrode 81. A silicon nitride layer is deposited and anisotropically etched to form nitride sidewall spacers 92 as shown in FIG. 13. A layer of titanium dioxide is also deposited and anisotropically etched to form titanium dioxide spacers 93 as shown in FIG. 13. In another embodiment, the titanium dioxide layer may be replaced or used in conjunction with oxides of magnesium, zirconium, tantalum, or the like. Optionally, the titanium dioxide layer does not need to be anisotropically etched, but covers all of the exposed surfaces of the semiconductor device. This optional embodiment is not shown in FIG. 13. During the formation of the spacers, hydrogen may have been generated and reduced $IrO_2$, if any was originally present. A short anneal using an oxidizing ambient may be performed, if needed, to oxidize some of the Ir to $IrO_2$. After spacer formation, $IrO_2$ should make up between 5–95 atomic percent of all of the iridium within the bottom electrode 81.

Figure 14:
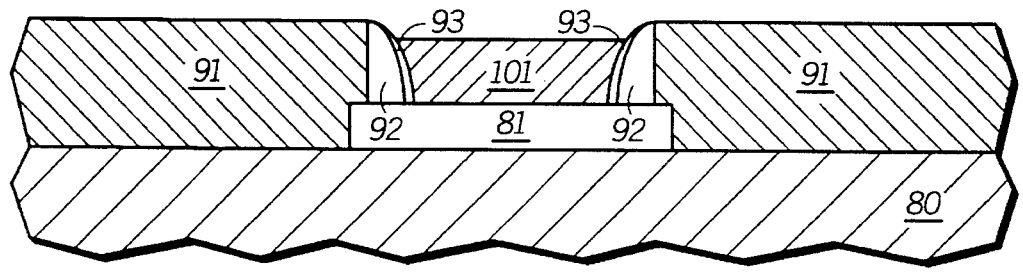

A ferroelectric layer 101 is formed that includes lanthanum-doped PZT as seen in FIG. 14. The ferroelectric layer 101 is deposited by one of the methods previously discussed in conjunction with layers that include PZT. The substrate including the ferroelectric layer 101 is patterned by chemical-mechanical polishing. To ensure that all of the ferroelectric layer 101 over the insulating layer 91 is removed, the ferroelectric layer 101 is wet etched using a solution including hydrofluoric acid, nitric acid, and hydrogen peroxide. In addition to removing any residual ferroelectric layer 101, the wet etching step also etches some of the ferroelectric layer 101 within the opening to make certain that the ferroelectric layer 101 only contacts the titanium dioxide spacers 93 and the bottom electrode 81. The substrate including the ferroelectric layer 101 is annealed in a manner similar to the ferroelectric layer 41 that was previously described.

Figure 15:
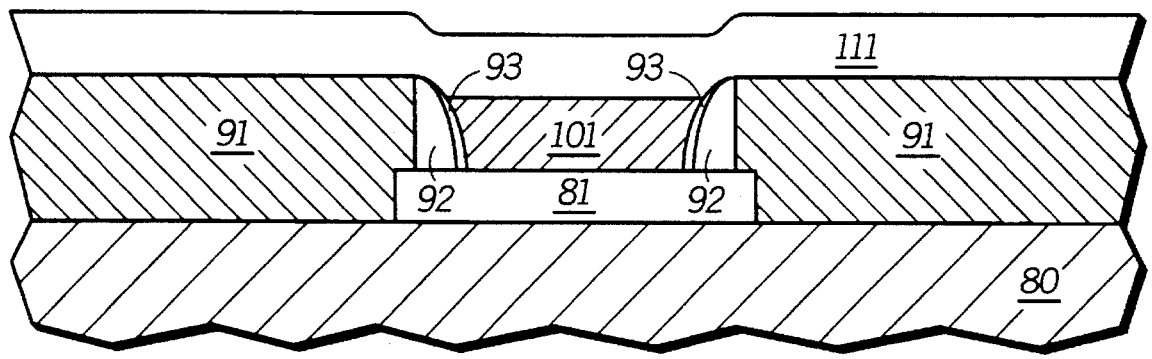

A top electrode 111 is formed and includes elemental osmium (Os) and osmium tetraoxide ($OsO_4$) as seen in FIG. 15. The $OsO_4$ makes up about 5–95 atomic percent of the total osmium in the top electrode 111, and the balance of the osmium in the top electrode 111 is Os. The top electrode 111 is deposited and patterned similar to the other layers previous described that include metals and their conductive metal oxides. Other layers and electrical connections are made to the ferroelectric capacitor, but are not shown in the figures.

In this embodiment, the ferroelectric layer has electrodes 81 and 111 that include metals and their conductive metal oxides. Nitride spacers 92 surround the sides of the ferroelectric layer 101 but do not contact the ferroelectric layer 101. Hydrogen should not contact the ferroelectric layer 101 via the sides because the nitride spacers 92 should act as a hydrogen barrier. The ferroelectric layer 101 was not reduced by hydrogen that is produced during the nitride spacer formation because the nitride spacers 92 were formed prior to the ferroelectric layer 101. The titanium dioxide spacers 93 separate the nitride spacers 92 and the ferroelectric layer 101. Therefore, the silicon within the nitride spacers 92 should not react with the ferroelectric layer 101. The electrodes 81 and 111 and the silicon nitride spacers 92 virtually encapsulate the ferroelectric layer 101. With this embodiment, reduction of the ferroelectric layer 101 is less likely than with conventional ferroelectric capacitors.

Figure 16:
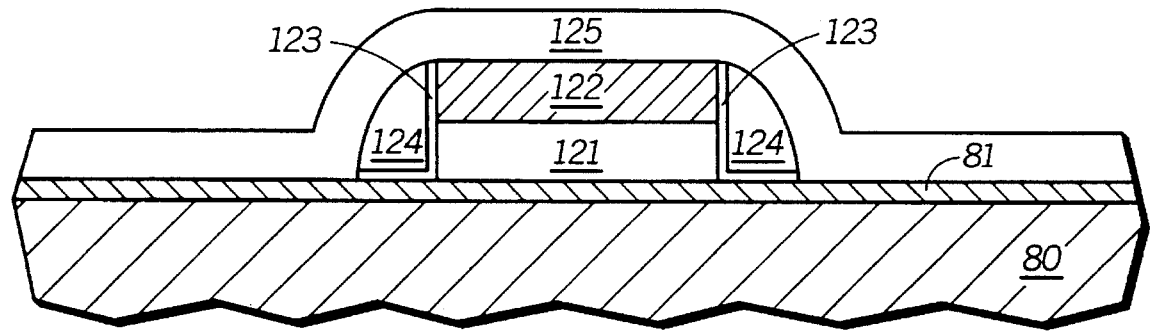

FIG. 16 includes another embodiment having a protected ferroelectric layer. FIG. 16 has an oxide layer 80 and a first silicon nitride layer 81. A conductive layer 21, which includes Re and $ReO_2$, and a ferroelectric layer 122, which includes PZT, are formed over the first silicon nitride layer 81. The conductive layer 121 acts as the bottom electrode, and $ReO_2$ within the conductive layer 121 lessens the likelihood of reducing the ferroelectric layer 122. The layers 121 and 122 are patterned using ion milling. The ion milling patterns the layers 121 and 122 so that they are coincident with each other. A titanium dioxide layer 123 and a second silicon nitride layer 124 are formed over the insulating layer 80 including the layers 121 and 122. The layers 123 and 124 are anisotropically etched to form sidewall spacers. The etch to form sidewall spacers may be performed in one or more steps. The deposition of silicon nitride generates hydrogen that may reduce the PbO within the ferroelectric layer. After the spacers have been formed, the substrate including the ferroelectric layer 122 is an annealed in an oxidizing ambient. This anneal is similar to the anneal used for ferroelectric layer 41 that was previously described. A top electrode 125 including Ru and $RuO_2$ is formed river the ferroelectric layer 122 and the sidewall spacers. $RuO_2$ within the top electrode 125 lessens the likelihood of reducing the ferroelectric layer 122. Both the conductive layer 121, which acts as the bottom electrode, and the ferroelectric layer 122 are virtually encapsulated by the first silicon nitride layer 81, the second silicon nitride layer 124 of the sidewall spacers, and the top electrode 125. Because it is not completely known if the degradation problems with ferroelectric capacitors are related to the bottom electrode or the ferroelectric layer, this embodiment may be effective against degradation problems since the bottom electrode and ferroelectric layer are more encapsulated than in other embodiments.

Figure 17:
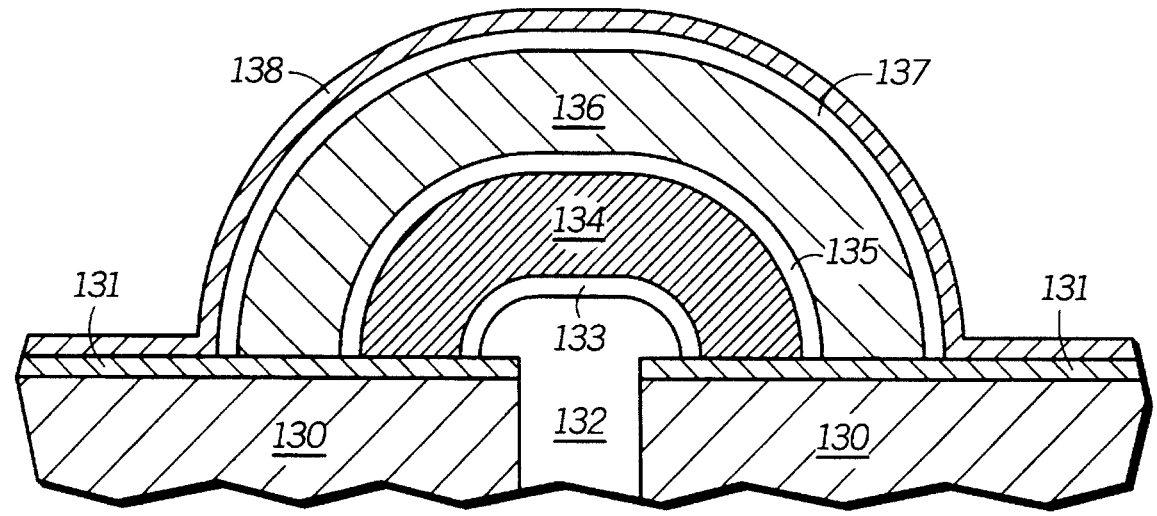

FIG. 17 includes a cross-sectional view of a portion of a semiconductor device having a ferroelectric capacitor and shielding layers to protect the ferroelectric capacitors from reducing agents. The substrate includes a first insulating layer 130 and a titanium dioxide layer 131. A polysilicon plug 132 is covered by a first conductive layer 133, such as Ru and $RuO_2$) that defines the first electrode of the capacitor. A ferroelectric layer 134 lies over the first conductive layer 133, and a platinum layer 135 lies over the ferroelectric layer 134. The platinum layer 135 acts as the second electrode for the capacitor. The formation of the device up to this point in the process, including the anneal of the ferroelectric layer 134, are conventional. A second insulating layer 136 is formed over the electrode and is thick enough so that there is little, if any, capacitive coupling between the platinum layer 135 and subsequently formed shielding layer. Typically, the second insulation layer 136 is at least about 5000 angstroms thick. The substrate including the second insulating layer 136 is annealed in an oxidizing ambient to lessen the amount of hydrogen that may be trapped within the second insulating layer 136.

Shielding layers 137 and 138 are formed over the second insulating layer 136. Shielding layer 137 includes a mixture of Ru and $RuO_2$ similar to layer 61. Shielding layer 138 includes silicon nitride and is formed by sputter deposition or plasma-enhanced chemical vapor deposition. The temperature and amount of hydrogen present during the silicon nitride deposition should be relatively low to minimize the reduction of $RuO_2$ to Ru within layer 137. After deposition of layer 138, the substrate is annealed in an oxidizing ambient to help oxidize some of the Ru within layer 137 and to seal any pinholes that may be present within layer 138. For a reducing agent, such as hydrogen, to interfere with the ferroelectric capacitor, the reducing agent must not only pass through layer 138 but also pass through layer 137 without reducing the $RuO_2$ to Ru within layer 137. This embodiment not only illustrates a good hydrogen barrier, but also shows that the shielding layers do not have to electrically participate in the semiconductor device if this is so desired.

In the foregoing specification, the invention has been described with reference to specific embodiments thereof. However, it will be evident that various modifications and changes can be made thereto without departing from the broader spirit or scope of the invention as set forth in the appended claims. The specification and drawings are, accordingly, to be regarded in an illustrative rather than a restrictive sense.

What is claimed is:

1. A semiconductor device comprising:
   a semiconductor substrate;
   an interconnect overlying the semiconductor substrate, wherein the interconnect includes copper;
   a first layer over the feature, wherein:
   the first layer has a mixture that includes an elemental metal and its conductive metal oxide;
   the elemental metal is rhenium; and
   the elemental metal is capable of being oxidized to its conductive metal oxide preferentially to the feature being oxidized.

2. The device of claim 1, wherein at least 5 atomic percent of the rhenium atoms within the first layer is in the elemental metal.

3. A ferroelectric capacitor:
   a ferroelectric layer that includes a lead-containing material;
   an electrode over the ferroelectric layer, wherein the electrode includes platinum; and
   a shielding layer over the electrode, wherein:
   the shielding layer is spaced apart from the electrode;
   the shielding layer surrounds a top and sides of the ferroelectric layer;
   the shielding layer has a mixture including an elemental metal and its conductive metal oxide; and
   the conductive metal oxide is capable of being reduced to the elemental metal preferentially to the ferroelectric layer being reduced.

4. The ferroelectric capacitor of claim 3, wherein the electrode also lies adjacent to at least one side of the ferroelectric layer.

5. The ferroelectric capacitor of claim 3, wherein the elemental metal is ruthenium.

6. The ferroelectric capacitor of claim 5, wherein at least 5 atomic percent of the ruthenium atoms within the shielding layer is in the conductive metal oxide.

* * * * *